(12) United States Patent
Hopkinson et al.

(10) Patent No.: US 6,633,168 B2
(45) Date of Patent: Oct. 14, 2003

(54) METHOD AND APPARATUS FOR DETECTING PARTIAL DISCHARGE IN A VOLTAGE TRANSFORMER

(75) Inventors: Philip J. Hopkinson, Charlotte, NC (US); Vadim Raff, Matthews, NC (US)

(73) Assignee: Square D Company, Palatine, IL (US)

( * ) Notice: Subject to any disclaimer, the term of this patent is extended or adjusted under 35 U.S.C. 154(b) by 81 days.

(21) Appl. No.: 09/821,963

(22) Filed: Mar. 30, 2001

(65) Prior Publication Data
US 2002/0140536 A1 Oct. 3, 2002

(51) Int. Cl.⁷ .......................... G01R 31/06; G01N 27/60
(52) U.S. Cl. ........................................ 324/547; 324/455
(58) Field of Search ................. 324/547, 544, 324/455, 536; 174/110 E, 122 G

(56) References Cited

U.S. PATENT DOCUMENTS

| | | | |
|---|---|---|---|
| 3,801,899 A | * 4/1974 | Liao | 324/536 |
| 4,586,015 A | * 4/1986 | Takahara et al. | 336/69 |
| 4,893,105 A | * 1/1990 | Maeda et al. | 123/634 |
| 4,914,382 A | * 4/1990 | Douville et al. | 324/102 |
| 5,530,366 A | * 6/1996 | Nasrallah | 324/536 |
| 5,612,624 A | * 3/1997 | Clinton | 324/527 |
| 6,368,530 B1 | * 4/2002 | Adubato et al. | 264/154 |
| 6,433,557 B1 | * 8/2002 | Rashkes et al. | 324/551 |

* cited by examiner

Primary Examiner—N. Le
Assistant Examiner—John Teresinski
(74) Attorney, Agent, or Firm—Michael J. Femal; Larry I. Golden

(57) ABSTRACT

A method and apparatus for detecting a partial discharge in a voltage transformer, the transformer having a first voltage winding and a second voltage winding. A grounded electrostatic shield being operably attached to the transformer, preferably between the windings. A radio frequency current transformer is operably connected to the electrostatic shield wherein the partial discharge occurring within the voltage transformer is detected.

27 Claims, 7 Drawing Sheets

METHOD AND APPARATUS FOR DETECTING PARTIAL DISCHARGE IN A VOLTAGE TRANSFORMER

The present invention is generally related to voltage transformers. More specifically, the present invention is related to detecting the presence of a partial discharge in a voltage transformer.

BACKGROUND OF INVENTION

Voltage transformers transfer AC voltage and current to different levels at essentially constant power and frequency. The power transfer is performed within a coil comprised of two voltage windings, i.e., circuits, operating at different voltages. Insulation can be placed between adjacent windings. The type and size of insulation is dependent upon the designed electric field stress. Depending upon the type of transformer, part of the voltage winding can be common to both circuits.

The transformer is constructed in a shell or core structure. In its simplest form, two voltage windings are operably linked by a magnetic core. The windings are comprised of a conductor sheet or a conductor wire having a circular or rectangular cross-section. Conductive materials such as copper, aluminum, etc. are used to construct the voltage windings. The windings can be configured for single-phase and three-phase operation, i.e., delta (Δ) and wye (Y) connections.

The performance life of a transformer is largely related to its insulation system and its operating temperature. Generally, the better the cooling system provided for the transformer, the higher kVA rating that can be designed. Large transformers utilize insulated fluid ducts to provide a path for cooling fluid to flow within the transformer. Some known cooling systems incorporate either air, oil, water or a combination thereof as the cooling fluid.

Other factors also affect the life of the transformer. Such factors include: vibration, insulation type, mechanical stress, repetitive expansion and contraction, exposure to moisture and other contaminants and electrical and mechanical stress associated with over-voltage and short-circuit currents.

Another factor affecting a transformer's performance is the occurrence of a partial discharge in the transformer. Partial discharge within a voltage transformer is an electric discharge that only partially bridges the insulation between conductors. The term "corona" has been frequently used with this connotation. The partial discharge causes insulation deterioration within the transformer and is often a reason for the eventual breakdown of the insulation system.

Presently, partial discharge is not easily detected outside of a controlled environment, such as a laboratory. Typically, a remote power source is implemented to induce a voltage in the transformer to be tested. A capacitor divider circuit provides a voltage tap on the transformer for connection to a radio frequency detector. The radio frequency detector monitors the transformer for the occurrence of a partial discharge. Because of the large test voltage, this type of partial discharge detector is susceptible to electrical noise hampering its ability to detect a partial discharge.

Another detection technique includes providing a sensor, i.e., antenna, within the coil structure for detecting electrostatic discharges.

In addition to being ineffective at detecting the occurrence of a partial discharge, these techniques are not easily implemented in the field.

This invention is directed to solving these and other problems.

SUMMARY OF THE INVENTION

The present invention is directed to detecting the occurrence of a partial discharge in a voltage transformer. More specifically, the present invention provides for detecting a partial discharge in a voltage transformer operating in a field environment.

According to an embodiment of the present invention, a detector system for detecting partial discharge in a voltage transformer having a first and second voltage winding comprises an electrostatic shield operably connected to the transformer. A radio frequency current transformer is operably connected to the electrostatic shield wherein a partial discharge occurring in the voltage transformer is identified by the electrostatic shield and the radio frequency current transformer.

Preferably the electrostatic shield is located between the voltage windings. The electrostatic shield substantially surrounds the first voltage winding and is located between the first and second voltage windings. The electrostatic shield is electrically grounded and insulated from the windings. The insulator comprises a glass mat impregnated with epoxy. A partial discharge occurring within the transformer is sensed by the electrostatic shield and identified by the radio frequency current transformer. More specifically, a ground current resulting from the occurrence of a partial discharge, flows through the electrostatic shield. The generated ground current is identified by the radio frequency current transformer.

Another embodiment of the present invention is directed to the electrostatic shield being operably attached to the transformer and substantially surrounding the second voltage winding. The electrostatic shield is operably connected with a conductor lead to electrical ground. A radio frequency current transformer is operably connected to the conductor lead of the electrostatic shield. A ground current generated by the partial discharge in the voltage transformer is sensed by the electrostatic shield and identified by the radio frequency current transformer. Operator personnel can monitor the occurrence of a partial discharge in the voltage transformer by observing the radio frequency current transformer.

An object of the present invention is to provide a low cost, dependable, partial discharge detector integral with a field deployed voltage transformer.

Another object of the present invention is to provide a reliable detector of a high frequency ground current signal generated by a partial discharge occurring within a voltage transformer.

A further object of the present invention is to provide a signal having an increased signal-to-noise ratio to represent the detection of a partial discharge occurring in a voltage transformer.

Other advantages and aspects of the present invention will become apparent upon reading the following description of the drawings and detailed description of the invention.

DETAILED DESCRIPTION OF PREFERRED EMBODIMENT

Figure 1:
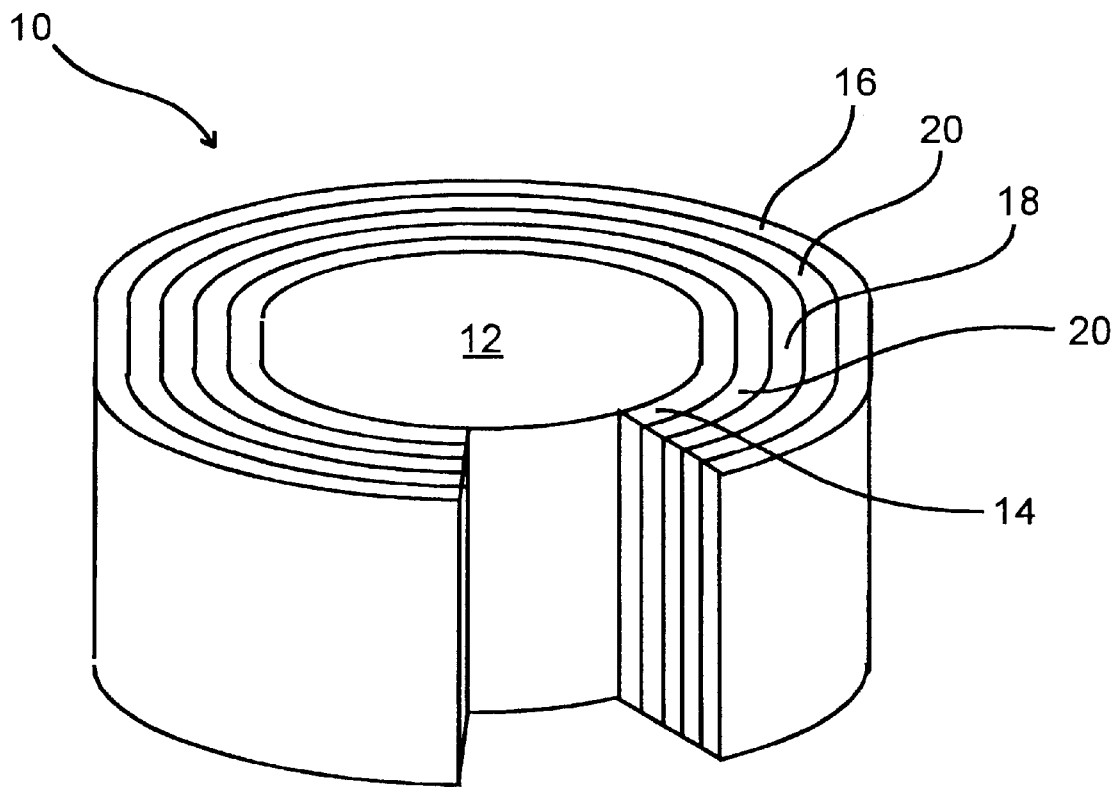
FIG. 1 is a partially segmented view of one embodiment of the present invention.

While this invention is susceptible of embodiments in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated.

FIG. 1 depicts an embodiment of the present invention directed to detecting a partial discharge in a voltage transformer 10. The transformer 10 includes a core 12, preferably iron or another similarly magnetic material, circumferentially surrounded by a first voltage winding 14 (secondary or low voltage winding) and a second voltage winding 16 (primary or high voltage winding). Each voltage winding 14, 16 has an inner surface and an outer surface. An electrostatic shield 18 is placed between the first 14 and second 16 voltage windings. An insulator 20, such as air or a glass mat impregnated with epoxy, can be placed between the electrostatic shield 18 and either, or both, windings 14, 16. The electrostatic shield 18 comprises copper, aluminum, a similarly conductive material or a combination thereof.

Figure 3:
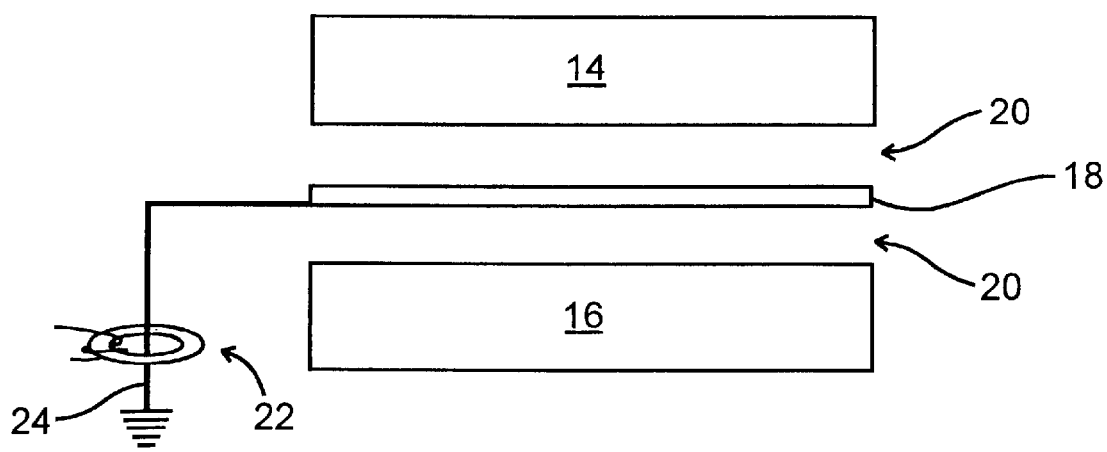
FIG. 3 is a diagram of another embodiment of the present invention.
Figure 5A:
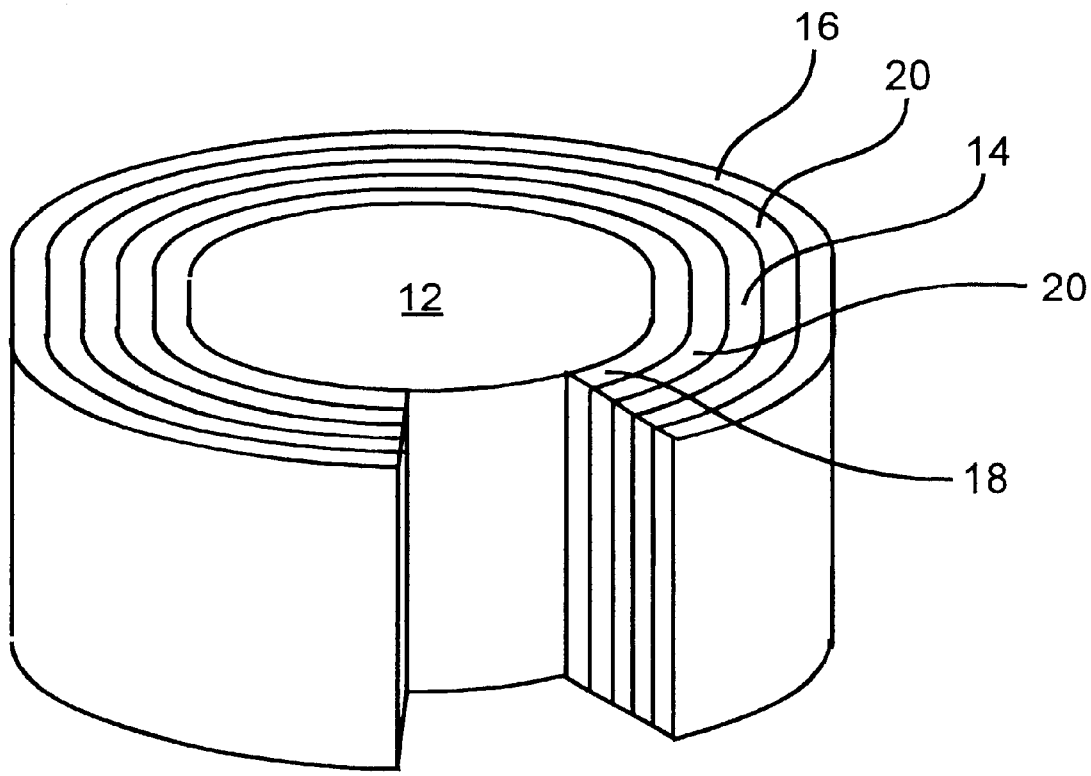
Figure 5B:
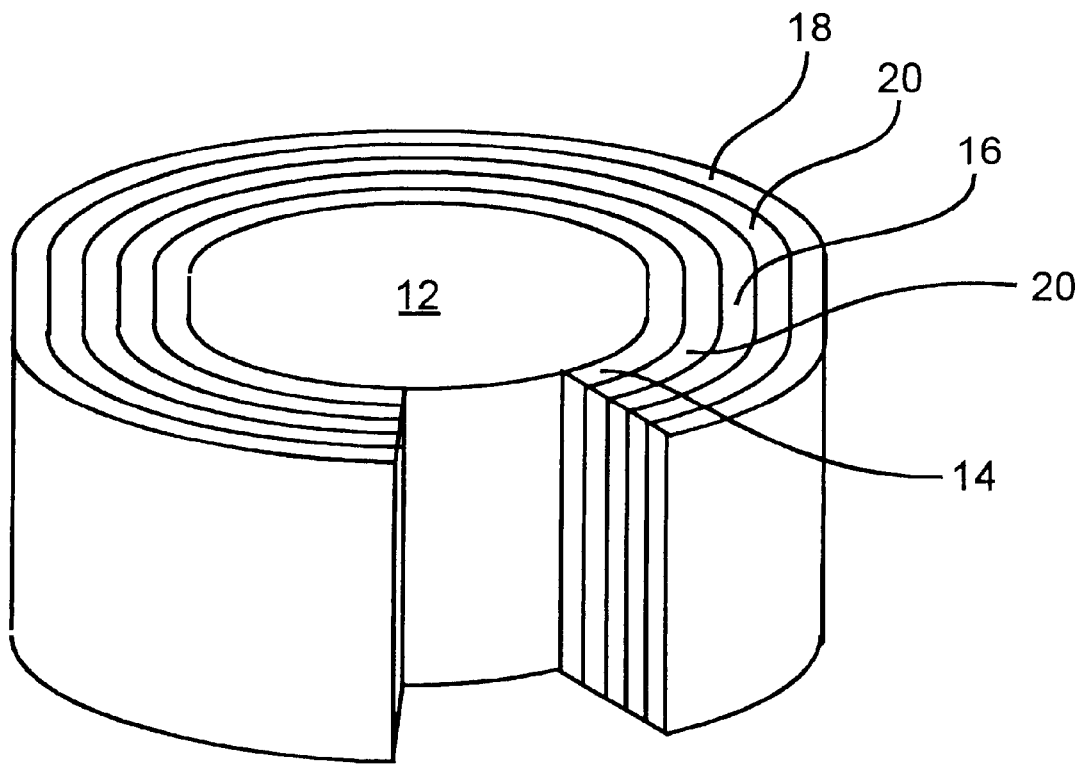
Figure 5C:
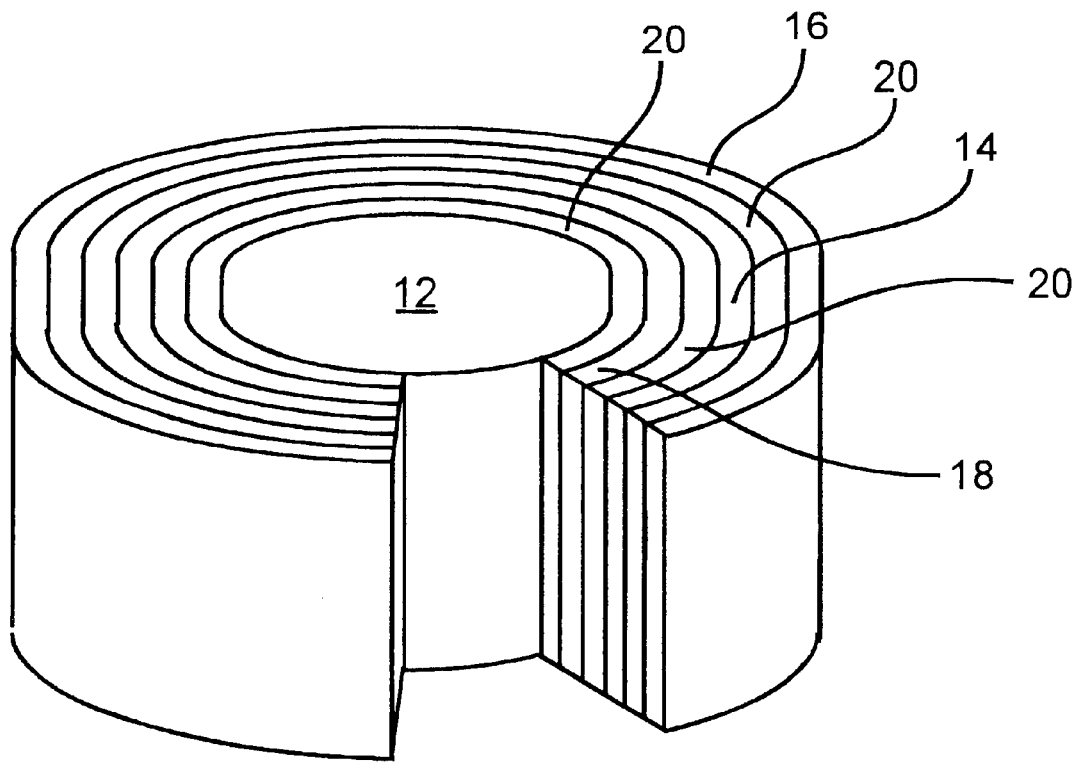

The structure of the transformer 10 influences the placement of the electrostatic shield 18. Preferably, the electrostatic shield 18 is operably attached to the transformer 10 between the voltage windings 14, 16. In a dual winding coil transformer, the electrostatic shield 18 substantially surrounds the first winding 14. Although it is preferred that the electrostatic shield 18 is located between the voltage windings 14, 16, the shield can also be operably attached to the transformer 10 about the outer surface of the second voltage winding 16, FIG. 5B, or about the core within the inner surface of the first winding 14. FIGS. 5A and 5C. The electrostatic shield 18 is operably connected to electrical ground, via a conductor lead 24. A radio frequency current transformer 22 is operably connected to the electrostatic shield 18, preferably via the conductor lead 24. FIG. 3.

A partial discharge occurring in the transformer 10 will be detected by the electrostatic shield 18 and radio frequency current transformer 22. The partial discharge induces a ground current in the electrostatic shield 18. The grounded electrostatic shield 18 reduces high frequency noise, thus facilitating a greater signal to noise ratio signal. The radio frequency current transformer 22 is constructed to identify an electrical ground current signal in the 10–20 MHz range.

Figure 2:
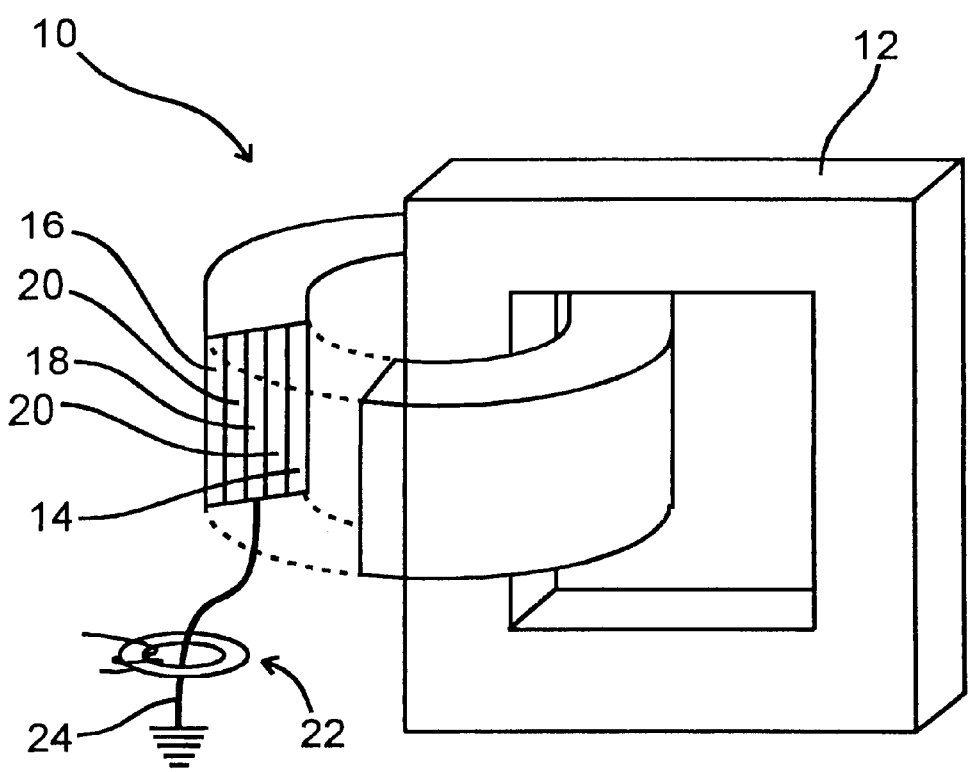
FIG. 2 is a partially segmented view of another embodiment of the present invention.

FIG. 2 depicts an alternative embodiment of the present invention. The electrostatic shield 18 is located between the voltage windings. The electrostatic shield 18 can substantially surround either voltage winding 14, 16. A conductor lead 24 preferably connects the electrostatic shield 18 to electrical ground. A radio frequency current transformer 22 is operably connected to the conductor lead 24. The occurrence of a partial discharge within the transformer 10 is be sensed by the electrostatic shield 18 and generates an electrical ground current in the conductor lead 24. The radio frequency current transformer 22 will identify the increased ground current, thus detecting the occurrence of a partial discharge.

Figure 4:
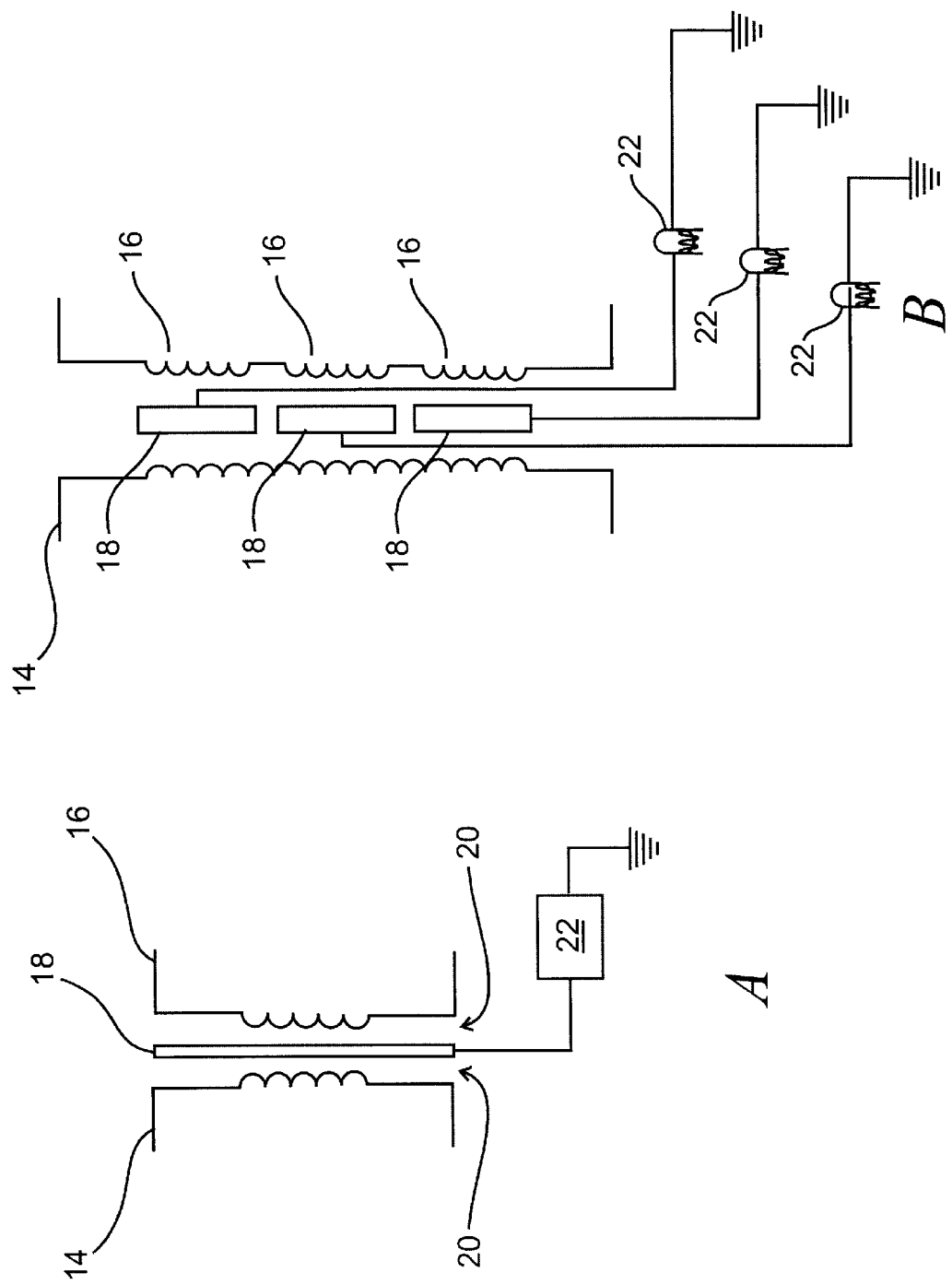
FIG. 4A is an partial electrical diagram of single-phase transformer of the present invention.
FIG. 4B is an partial electrical diagram of three-phase transformer of the present invention; and, FIGS. 5A–5C are partially segmented views of other embodiments of the present invention.

The present invention operates well with epoxy cast resin and open ventilated transformers, but can also be utilized with other transformers as well. It is to be understood that the present invention can be utilized in single-phase applications as well as three-phase applications, 3Φ, i.e., delta or wye configurations. FIGS. 4A and 4B. The electrostatic shield 18 is operably located between the first voltage winding 14 and the second voltage winding 16, or second windings, for detecting the occurrence of a partial discharge in the transformer.

While the specific embodiment has been illustrated and described, numerous modifications come to mind without significantly departing from the spirit of the invention, and the scope of protection is only limited by the scope of the accompanying claims.

I claim:

1. A detector for detecting partial discharge in a voltage transformer, the transformer having a primary voltage winding and a secondary voltage winding, each voltage winding including a surface wherein the primary voltage winding and the secondary voltage winding are substantially concentric about an axis extending parallel to the surfaces, the transformer for transforming a primary voltage on the primary winding to a secondary voltage on the secondary winding the detector comprising:

an electrostatic shield operably attached to the transformer between the primary winding and the secondary winding, the electrostatic shield having a surface substantially parallel to the surfaces of the first and second voltage windings; and, a radio frequency current transformer operably connected to the electrostatic shield wherein the occurrence of a partial discharge from one of the windings in the voltage transformer is detected by the radio frequency current transformer.

2. The detector of claim 1 further comprising an insulator operably attached to the transformer between the low voltage winding and the electrostatic shield wherein the low voltage winding is insulated from the electrostatic shield.

3. The detector of claim 2 wherein the insulator comprises a glass mat impregnated with an epoxy.

4. The detector of claim 1 wherein the electrostatic shield comprises copper.

5. The detector of claim 1 wherein the electrostatic shield comprises aluminum.

6. The detector of claim 1 wherein the electrostatic shield is operably connected to electrical ground.

7. A detector for a voltage transformer having a coil comprising a primary voltage winding and a secondary voltage winding, the transformer for transforming a primary voltage on the primary winding to a secondary voltage on the secondary winding, each voltage winding having an inner surface and an outer surface, the inner surface of the secondary voltage winding surrounds the outer surface of the primary voltage winding wherein the primary voltage winding and the secondary voltage winding are substantially concentric about an axis extending parallel to the inner and outer surfaces, the detector comprising:

an electrostatic shield operably attached to the voltage transformer, the electrostatic shield having a surface substantially parallel to, and disposed between, the surfaces of the voltage windings; and, a radio frequency current transformer operably connected to the electrostatic shield wherein the partial discharge occurring from one of the windings in the voltage transformer is detected.

8. The detector of claim 7 wherein the electrostatic shield is also operably connected to electrical ground.

9. The detector of claim 8 wherein the electrostatic shield operably attached to the voltage transformer substantially surrounds the outer surface of the primary voltage winding, the electrostatic shield being located between the primary and second voltage windings.

10. The detector of claim 8 wherein the electrostatic shield operably attached to the voltage transformer substantially surround the outer surface of the secondary voltage winding.

11. The detector of claim 7 wherein the electrostatic shield comprises copper.

12. The detector of claim 7 wherein the electrostatic shield comprises aluminum.

13. The detector of claim 7 wherein the insulator comprises a glass mat impregnated with an epoxy.

14. A detector for detecting a partial discharge in a voltage transformer, the transformer having a coil comprising a primary voltage winding and a secondary voltage winding, the transformer for transforming a primary voltage on the primary winding to a secondary voltage on the secondary winding, each voltage winding having a surface substantially concentric about an axis extending parallel to the voltage winding surfaces, the detector comprising:

an electrostatic shield operably attached to the voltage transformer, the electrostatic shield being electrically grounded and having a surface substantially parallel to and disposed between, the surfaces of the voltage windings;

an insulator attached to the voltage transformer and insulating the electrostatic shield from the primary first voltage winding; and, a radio frequency current transformer operably connected to the electrostatic shield wherein a current generated by the partial discharge occurring from the primary winding within the voltage transformer is detected by the radio frequency current transformer.

15. The detector of claim 14 wherein the primary voltage winding is a low voltage winding and the secondary voltage winding is a high voltage winding.

16. The detector of claim 14 wherein the electrostatic shield comprises copper.

17. The detector of claim 14 wherein the electrostatic shield comprises aluminum.

18. The detector of claim 14 wherein the insulator comprises a glass mat impregnated with an epoxy.

19. A method for detecting partial discharge in a voltage transformer having a primary voltage winding and a secondary voltage winding, the transformer for transforming a primary voltage on the primary winding to a secondary voltage on the secondary winding, the method comprising the steps of:

operably attaching an electrically grounded electrostatic shield substantially around one of the voltage windings, the electrostatic shield being insulated from the one of the windings by an insulator;

operably connecting a radio frequency current transformer to the electrostatic shield; and, detecting a current generated in the electrostatic shield by the occurrence of a partial discharge in the voltage transformer.

20. The method of claim 19 wherein a frequency for the current detected is within the range of 10–20 MHz.

21. The method of claim 19 wherein the insulator is a glass mat impregnated with an epoxy.

22. The method of claim 19 wherein the one of the voltage windings is the primary voltage winding.

23. The method of claim 19 wherein the one of the voltage windings is the secondary voltage winding.

24. A detector for detecting partial discharge in a voltage transformer, the transformer having a longitudinal axis, a primary voltage winding, and a secondary voltage winding, the transformer for transforming a primary voltage on the primary winding to a secondary voltage on the secondary winding, the detector comprising:

an electrostatic shield operably attached to the transformer concentric about the longitudinal axis and in a parallel spaced relationship with the primary and secondary voltage windings; and, a radio frequency current transformer operably connected to the electrostatic shield wherein the occurrence of a partial discharge from the adjacent one of the windings in the voltage transformer is detected by the radio frequency current transformer.

25. The detector of claim 24 wherein the electrostatic shield is disposed between the primary and secondary windings.

26. The detector of claim 24 wherein the primary voltage winding is disposed between the electrostatic shield and the secondary voltage winding.

27. The detector of claim 24 wherein the secondary voltage winding is disposed between the electrostatic shield and the primary voltage winding.

* * * * *

UNITED STATES PATENT AND TRADEMARK OFFICE
CERTIFICATE OF CORRECTION

PATENT NO. : 6,633,168 B2
DATED : October 14, 2003
INVENTOR(S) : Phillip J. Hopkinson and Vadim Raff It is certified that error appears in the above-identified patent and that said Letters Patent is hereby corrected as shown below:

<u>Title page,</u>
Item [75], should read:
-- [75]   Inventors:    Phillip J. Hopkinson, Charlotte, NC
    Vadim Raff, Matthews, NC
    Scott E. May, Greer, SC --

Signed and Sealed this

Twentieth Day of January, 2004

JON W. DUDAS
*Acting Director of the United States Patent and Trademark Office*